(12) United States Patent
Chen

(10) Patent No.: US 7,418,648 B2
(45) Date of Patent: *Aug. 26, 2008

(54) SYSTEM AND METHOD FOR GENERATING A CYCLIC REDUNDANCY CHECK

(75) Inventor: Hongyi Hubert Chen, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 107 days.

This patent is subject to a terminal disclaimer.

(21) Appl. No.: 11/385,962

(22) Filed: Mar. 21, 2006

(65) Prior Publication Data

US 2006/0161832 A1 Jul. 20, 2006

Related U.S. Application Data

(63) Continuation of application No. 10/039,585, filed on Jan. 4, 2002, now Pat. No. 7,216,285.

(60) Provisional application No. 60/338,137, filed on Nov. 9, 2001.

(51) Int. Cl.
H03M 13/00 (2006.01)

(52) U.S. Cl. .................. 714/781; 714/758; 714/807

(58) Field of Classification Search .............. 714/758, 714/781, 807

See application file for complete search history.

(56) References Cited

U.S. PATENT DOCUMENTS

| | | | |
|---|---|---|---|
| 5,132,975 A | 7/1992 | Avaneas | 714/757 |
| 5,598,424 A | 1/1997 | Erickson et al. | 714/799 |
| 5,724,368 A | 3/1998 | Zook | 381/71.1 |
| 6,192,498 B1* | 2/2001 | Arato | 714/781 |
| 6,295,626 B1 | 9/2001 | Nair et al. | 714/807 |
| 6,344,807 B1* | 2/2002 | Hassner et al. | 341/59 |
| 6,412,093 B1* | 6/2002 | Argentati et al. | 714/807 |
| 6,519,738 B1 | 2/2003 | Derby | 714/781 |
| 6,560,746 B1 | 5/2003 | Morsberger | 714/781 |
| 6,631,488 B1 | 10/2003 | Stambaugh et al. | 714/746 |
| 6,754,870 B2 | 6/2004 | Yoshida et al. | 714/758 |
| 7,216,285 B2* | 5/2007 | Chen | 714/781 |

* cited by examiner

Primary Examiner—Esaw Abraham

(57) ABSTRACT

A Cyclic Redundancy Check (CRC) system comprises N+1 shift registers. N+1 logic gates having first inputs communicate with outputs of corresponding ones of said N+1 shift registers. N+1 programmable registers store a corresponding CRC coefficient of a $3^{rd}$ to Nth order CRC polynomial key word, wherein N is an integer greater than two. N+1 multiplexers communicate with outputs of corresponding ones of said N+1 logic gates. At least N of said N+1 multiplexers communicate with corresponding ones of at least N of said N+1 programmable registers.

8 Claims, 4 Drawing Sheets

US 7,418,648 B2

SYSTEM AND METHOD FOR GENERATING A CYCLIC REDUNDANCY CHECK

CROSS-REFERENCE TO RELATED APPLICATIONS

This application is a Continuation of U.S. Ser. No. 10/039,585 filed on Jan. 4, 2002 now U.S. Pat. No. 7,216,285, which application claims the priority benefit of U.S. Provisional Patent Application Ser. No. 60/338,137, filed Nov. 9, 2001, entitled, "SYSTEM AND METHOD FOR GENERATING A CYCLIC REDUNDANCY CHECK". All of these applications are hereby incorporated by reference in their entirety.

FIELD OF THE INVENTION

The invention generally relates to electronic systems. The invention relates more specifically to systems and methods for generating cyclic redundancy check.

BACKGROUND OF THE INVENTION

A popular method for error detection for digital signals is the Cyclic Redundancy Check (CRC). CRC works by treating the message string that is sent between a transmitter and a receiver as a single binary word. The single binary word is divided by a key word that is agreed upon by both the transmitter and the receiver ahead of time. The remainder that is left after dividing the single binary word by the key word is known as a check word. The transmitter sends both the message string and the check word to the receiver. The receiver then verifies the data by dividing the data by the key word. If the remainder, obtained by dividing the data by the key word, matches the check word, then the receiver can be sure that the data is indeed the correct message string from the transmitter.

In the context of CRC, key words are usually numbers and are presented in the form of polynomials whose coefficients are in the form of the binary bits of the key word. A popular key word is $X^{16}+X^{12}+X^5+1$ known as the X25 standard. Key words will herein be referred to as polynomial key words.

CRC is often implemented in hardware that is specific to a given polynomial key word. A CRC that is implemented in hardware is herein referred to as a CRC generator. Thus, a system that has to verify data using various different polynomial key words will need a separate CRC generator that is dedicated to each distinct polynomial key word. For example, FIG. 1 is a block diagram that illustrates a CRC generator that employs a $3^{rd}$ order polynomial key word, $X^3+X^2+1$.

In FIG. 1, exclusive-OR gates (XOR gates) 110, 112, and 116 are communicatively coupled to each other and to corresponding shift registers 102, 104 and 106. Input 101 is initially received at XOR gate 110. The output of the CRC generator in FIG. 1 is 118.

FIG. 2 is block diagram that illustrates a CRC generator that employs a 1st order polynomial key word, $X^1+1$. In FIG. 2, XOR gates 210, and 212 are communicatively coupled to each other and to corresponding shift registers 202, and 204. Input 220 is initially received at XOR gate 210. The output of the CRC generator in FIG. 2 is 222. A system with multiple CRC generators can be unwieldy and inefficient.

SUMMARY OF THE INVENTION

A Cyclic Redundancy Check (CRC) system comprises N+1 shift registers. N+1 logic gates having first inputs communicate with outputs of corresponding ones of said N+1 shift registers. N+1 programmable registers store a corresponding CRC coefficient of a $3^{rd}$ to $N^{th}$ order CRC polynomial key word, wherein N is an integer greater than two. N+1 multiplexers communicate with outputs of corresponding ones of said N+1 logic gates. At least N of said N+1 multiplexers communicate with corresponding ones of at least N of said N+1 programmable registers.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

A system and method for generating a cyclic redundancy check is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention. Embodiments are described herein according to the following outline:

1.0 OPERATIONAL CONTEXT AND FUNCTIONAL OVERVIEW
2.0 N-BIT CAPABLE CRC GENERATOR
3.0 ILLUSTRATIVE EXAMPLE OF THE FLEXIBILITY OF AN N-BIT CAPABLE CRC GENERATOR
5.0 EXTENSIONS AND ALTERNATIVES 1.0 Operational Context and Functional Overview In certain embodiments of the present invention, a universal CRC generator is used in a system that receives digital signals. The universal CRC generator can be programmed to be a specific polynomial key word CRC generator. Thus, one set of hardware can be adapted for any given polynomial key word. For example, for purposes of explanation, assume that a transmitter of a bitstream and a receiver of the same bitstream agree upon a key word that can be represented by the polynomial, $X^{16}+X^{12}+X^5+1$. The universal CRC can be programmed to be an $X^{16}+X^{12}+X^5+1$ polynomial key word CRC generator. Generally, an $N^{th}$ polynomial key word CRC generator is also referred to as an N-bit CRC generator. Each time that the key word is changed, the universal $CRC_{generator}$ can be re-programmed to correspond to the new key word. It is to be noted that an $N^{th}$ order polynomial key word has (N+1) bits.

Thus, in certain embodiments of the present invention, the universal CRC generator is a CRC generator that is capable of being a N-bit CRC generator, where N is a positive integer that is selected corresponding to the highest order polynomial key word that the universal CRC generator is expected to use. A universal generator that is capable of being an N-bit CRC generator is herein referred to as an "N-bit capable" CRC generator.

According to certain embodiments of the present invention, the universal CRC generator can be re-programmed to correspond to a new polynomial key word by programming the values of certain programmable registers that are part of the universal CRC generator and by programming certain selection inputs for multiplexers that are also part of the universal CRC generator. The programming of the registers and selection inputs for the multiplexers are explained in greater detail herein.

2.0 N-Bit Capable CRC Generator

Figure 3A:
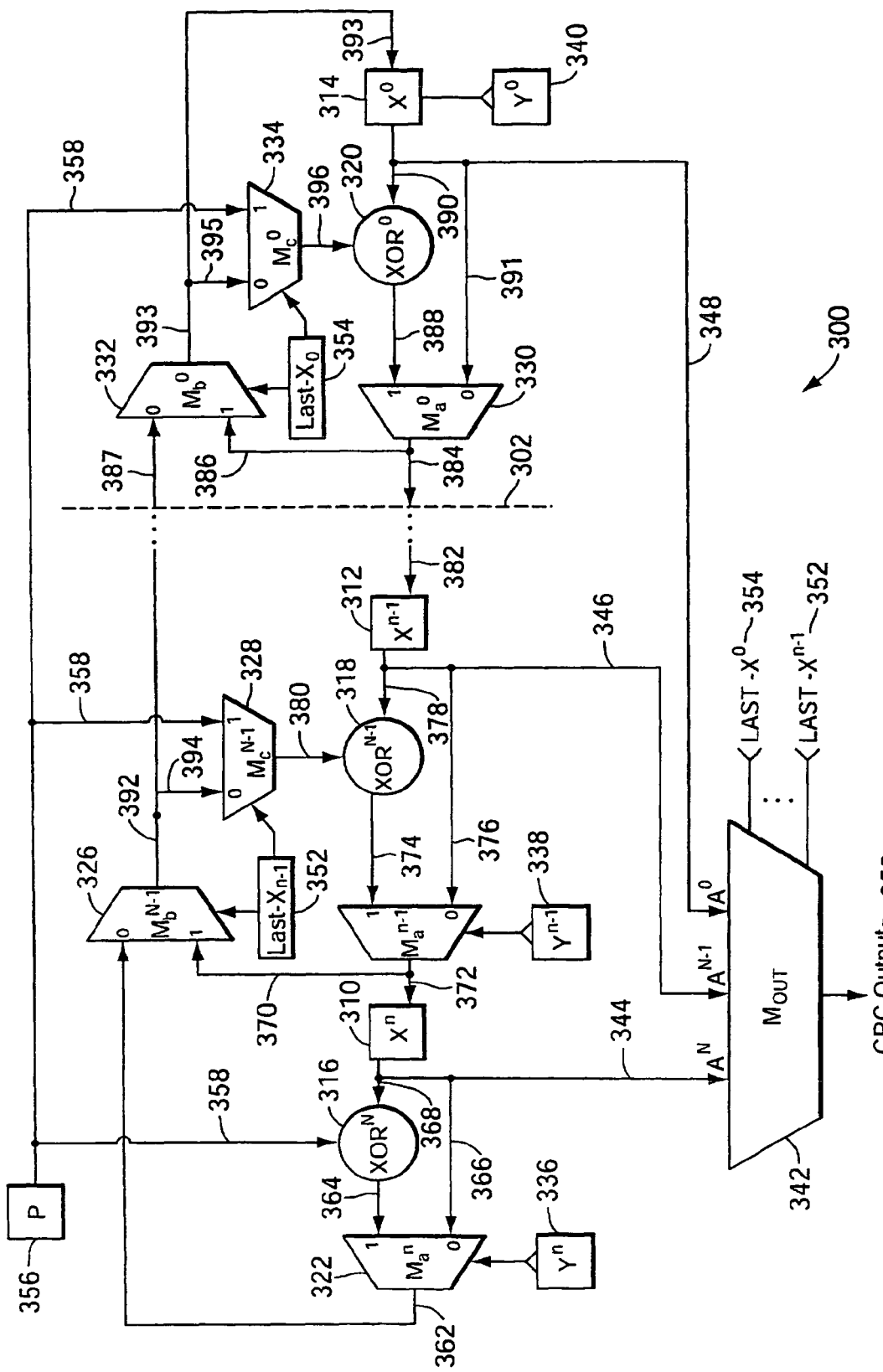
FIG. 3A is block diagram that illustrates an exemplary N-bit capable CRC generator.

According to certain embodiments of invention, FIG. 3A is block diagram that illustrates an N-bit capable CRC generator. An N-bit capable CRC generator is a universal CRC generator for which the highest order polynomial key word is N. Thus, an N-bit capable CRC generator can be used for polynomial key words of orders ranging from 1 to N. The N-bit CRC generator of FIG. 3A comprises the following as indicated in List A.

List A:
1) N+1 number of shift registers, namely, $X^n$ 310, $X^{(n-1)}$ 312, ..., $X^0$ 314;
2) N+1 number of exclusive-OR gates, namely, $XOR^n$ 316, $XOR^{(n-1)}$ 318, ..., $XOR^0$ 320;
3) 3N+1 number of multiplexers, namely, $M_a^n$ 322, $M_a^{(n-1)}$ 324, $M_b^{(n-1)}$ 326, $M_c^{(n-1)}$ 328, ..., $M_a^0$ 330, $M_b^0$ 332, $M_c^0$ 334; and
4) N+1 programmable registers, namely, $Y^n$ 336, $Y^{(n-1)}$ 338, ..., $Y^0$ 340.

The broken line 302 in FIG. 3A indicates that the following components as indicated in List B are not shown on FIG. 3A for want of space.

List B:
1) shift registers $X^{(n-2)}$, $X^{(n-3)}$, up to $X^1$;
2) exclusive-OR gates $XOR^{(n-2)}$, $XOR^{(n-31)}$, ..., up to $XOR^1$;
3) multiplexes $M_a^{(n-2)}$, $M_b^{(n-2)}$, $M_c^{(n-2)}$, ..., up to $M_a^1$, $M_b^1$, $M_c^1$;
4) programmable registers $Y^{(n-2)}$), $Y^{(n-3)}$, ..., up to $Y^1$;

Each of the shift registers X is communicatively coupled to a corresponding exclusive-OR gate (XOR gate) and to adjacent multiplexers M. For example, in FIG. 3A, shift register $X^n$ 310 is communicatively coupled to a corresponding XOR gate, $XOR^n$ 316. Specifically, line 368 is shown as the output from $X^n$ 310. Line 368 is also the input to XOR gate, $XOR^n$ 316. Similarly, shift register $X^{n-1}$ 312 is communicatively coupled to a corresponding XOR gate, $XOR^{n-1}$ 318, etc. Line 378 is shown as the output from $X^{n-1}$ 312. Line 378 is also the input to XOR gate, $XOR^{n-1}$ 318. However, shift register $X^0$ 314 is communicatively coupled to only one XOR gate, viz., $XOR^0$ 320. Line 390 is shown as the output from $X^0$ 314. Line 390 is also the input to XOR gate, $XOR^0$ 320.

Further, each of the shift registers X in FIG. 3A is communicatively coupled to corresponding adjacent multiplexers M. For example, shift register $X^n$ 310 is communicatively coupled to adjacent multiplexers $M_a^n$ 322 and $M^{a(n-1)}$ 324. Specifically, line 366 is shown as an output from shift register $X^n$ 310. Line 366 is also the input to multiplexer $M_a^n$ 322. Line 372 is shown as an output from multiplexer $M_a^{n-1}$ 324. Line 372 is also an input to shift register $X^n$ 310.

Similarly, shift register $X^{n-1}$ 312 is communicatively coupled to adjacent multiplexers $M_a^{n-1}$ 324, etc. Specifically, line 376 is shown as an output from shift register $X^{n-1}$ 312. Line 376 is also the input to multiplexer $M_a^{n-1}$ 324. Line 382 is shown as an output from multiplexer $M_a^{n-2}$ (note that $M^{a n-2}$ is not shown in FIG. 3A). Line 382 is also an input to shift register $X^{n-1}$ 312.

Shift register $X^0$ 314 is communicatively coupled to adjacent multiplexer $M_a^0$ 330. Specifically, line 391 is shown as an output line from shift register $X^0$ 314. Line 391 is also an input line to multiplexer $M_a^0$ 330. Line 393 is shown as an output line from multiplexer $M_b^0$ 332. Line 393 is also an input line to shift register $X^0$ 314

Further, all shift registers $X^n$ 310, $X^{(n-1)}$ 312, ..., $X^0$ 314 in FIG. 3A are communicatively coupled to multiplexer $M_{out}$ 342 via lines An 344, $A^{n-1}$ 346, ..., up to $A^0$ 348. For example, shift register $X^n$ 310 is connected to $M_{out}$ 342 via line $A^n$ 344. Shift register $X^{n-1}$ 312 is connected to $M_{out}$ 342 via line $A^{n-1}$ 346, etc. Further, CRC output 350 is the output of the N-bit capable CRC generator.

Each XOR gate is additionally communicatively coupled to corresponding adjacent multiplexers. For example, in FIG. 3A, XOR gate $XOR^{(n-1)}$ 318 is communicatively coupled to adjacent corresponding multiplexers $M^{a(n-1)}$ 324 and $M_c^{(n-1)}$ 328. Specifically, line 380 is shown as an input line from multiplexer $M_c^{(n1-1)}$ 328 to XOR gate $XOR^{(n-1)}$ 318. Line 374 is an output line from XOR gate $XOR^{(n-1)}$ 318 to multiplexer $M_a^{(n-1)}$ 324.

Similarly, XOR gate $XOR^0$ 320, is communicatively coupled to adjacent corresponding multiplexers $M_a^0$ 330 and M $M_c^0$ 334, etc. Specifically, line 396 is shown as an input line from multiplexer M $M_c^0$ 334 to XOR gate $XOR^0$ 320. Line 388 is an output line from XOR gate $XOR^0$ 320 to multiplexer $M_a^0$ 330. However, XOR gate $XOR^n$ 316 is communicatively coupled to only one adjacent corresponding multiplexer $M_a^n$ 322. Line 364 is shown as an output line from $XOR^n$ 316 to multiplexer $M_a^n$ 322.

Programmable registers $Y^n$ 336, $Y^{(n-1)}$ 338, ..., $Y^0$ 340 are each communicatively coupled to a corresponding multiplexer. For example, programmable register $Y^n$ 336 is communicatively coupled to multiplexer $M_a^n$ 322, programmable register $Y^{(n-1)}$ 338 is coupled to multiplexer $M_a^{(n-1)}$ 324, etc.

For simplicity, programmable registers $Y^n$ 336, $Y^{(n-1)}$ 338, ..., $Y^0$ 340 are collectively referred to herein as Y registers.

The Y registers are programmed based on the given polynomial key word. To explain, each Y register in the N-bit capable CRC generator is associated with one term in the general $N^{th}$-order polynomial, $C_n X^n + C_{n-1} X^{n-1} + C_{n-2} X^{n-2} + \ldots + C_2 X^2 + C_1 X^1 + C_0 X^0$, where $C_n, C_{n-1}, C_{n-2}, \ldots, C_2, C_1$, and $C_0$ are the coefficients of the general $N^{th}$-order polynomial and are constants.

Each Y register corresponds to one coefficient of the general $N^{th}$-order polynomial. Specifically, programmable register $Y^n$ 336 in FIG. 3A corresponds to coefficient $C_n$, programmable register $Y^{n-1}$ 338 corresponds to coefficient $C_{n-1}$ and so on. The given polynomial key word is compared to the general $N^{th}$ order polynomial to determine which of the coefficients of the general $N^{th}$-order polynomial are to take the value of zero in order to convert the $N^{th}$-order general polynomial into the given polynomial key word.

The Y registers that correspond to coefficients that have a value of zero are programmed to have a bit value of zero. The Y registers that correspond to coefficients that have a value of 1 are programmed to have a bit value of 1.

The value of each bit in the Y register determines which input is selected at the corresponding multiplexer to be an output. For example, if programmable register $Y^n$ 336 is programmed to have a bit value of 1, multiplexer $M_a^n$ 322 will receive the value 1 as an input from programmable register $Y^n$ 336. In FIG. 3A, it can be seen that multiplexer $M_a^n$ 322 has 2 input lines, labeled "1" and "0" respectively. Since the value 1 is received from programmable register $Y^n$ 336 multiplexer $M_a^n$ 322 will select the input line labeled "1" to be the output of $M_a^n$ 322 for a particular cycle.

Figure 3B:
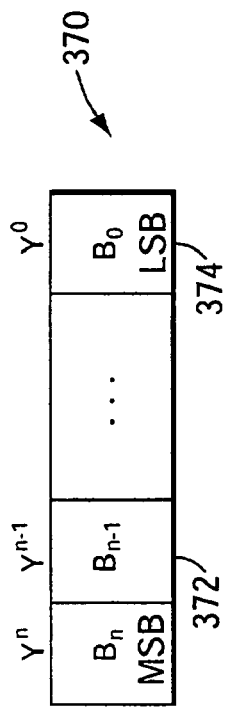
FIG. 3B is a block diagram that illustrates the most significant bit (MSB) to the least significant bit (LSB) in relation to programmable registers.

FIG. 3B is a block diagram that illustrates the most significant bit (MSB) to the least significant bit (LSB) in relation to the programmable registers Y 370. Bit $B_n$ corresponds to the value in register $Y^n$ 336, and is the MSB if the value of $Y^n$ 336 is the first occurring "1" bit. Similarly, bit $B_{n-1}$ corresponds to the value in register $Y^{n-1}$ 338, etc. Bit Bo corresponds to the value in register $Y^0$ 340, and is the LSB.

For ease of explanation, multiplexers with the same superscript as illustrated in FIG. 3A are said to belong to the same family. As can be seen in FIG. 3A, multiplexers that belong to the same family are communicatively coupled to form part of a feedback loop. For example, multiplexer $M_a^{(n-1)}$ 324 is communicatively coupled to multiplexer $M_b^{(n-1)}$ 326 that is in turn communicatively coupled to multiplexer $M_c^{(n-1)}$ 328. Multiplexer $M_a^0$ 330 is communicatively coupled to multiplexer $M_b^0$ 332 that is in turn communicatively coupled to multiplexer $M_c^0$ 334. However, multiplexer $M_a^n$ 322, being the sole member in its family is communicatively coupled only to one multiplexer that belongs to another family, viz., multiplexer $M_b^{(n-1)}$ 326.

Selection inputs such as, Last-$X^{(n-1)}$ 352, Last-$X^{(n-2)}$ (not shown in FIG. 3A), . . . , Last-$X^0$ 354, are received as inputs into corresponding multiplexers with subscripts "b" and "c" and that belong to the same family. For example, Last-$X^{(n-1)}$ 352 is a selection input into multiplexers $M_b^{(n-1)}$ 326 and $M^{c(n-1)}$ 328, and Last-$X^0$ 354 is a selection input into multiplexers $M_b^0$ 332 and $M_c^0$ 334, etc.

Further, all selection inputs, namely, Last-$X^{(n-1)}$ 352, Last-$X^{(n-2)}$ (not shown in FIG. 3A), . . . , Last-$X^0$ 354 are input into multiplexer $M_{out}$ 342. It is to be noted that, in certain embodiments, there is no Last-$X^n$ selection input.

For simplicity in explaining the function of the components in FIG. 3A, selection inputs such as Last-$X^{(n-1)}$ 352, Last-$X^{(n-2)}$ (not shown in FIG. 3A), . . . , Last-$X^0$ 354 are collectively referred to herein as Last-X selection inputs.

Figure 4:
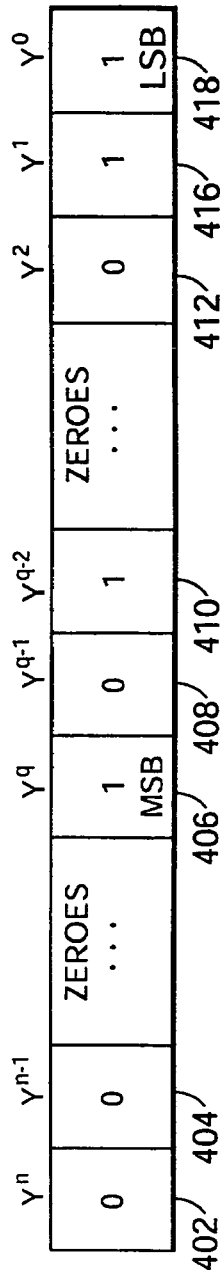
FIG. 4 is a block diagram that illustrates the position of the MSB that is associated with a $q^{th}$ order polynomial key word.

Generally, selection inputs such as, Last-$X^{(n-1)}$ 352, Last-X $X^{(n-2)}$ (not shown in FIG. 3A), . . . , Last-$X^0$ 354, are programmed to be a specific value based on the most significant bit (MSB) of the Y registers. For purposes of illustration, assume that the given polynomial key word is a $q^{th}$ order polynomial, where q is a positive integer that is less than N. FIG. 4 is a block diagram that illustrates the position of the MSB that is associated with a $q^{th}$ order polynomial key word In FIG. 4, bit $B_n$ has the value of the $Y^n$ register that is programmed as described herein. Bit $B_{n-1}$ has the value of the $Y^{n-1}$ register, bit $B_{n-2}$ has the value of the $Y^{n-2}$ register, . . . , bit $B_q$ has the value of the $Y^q$ register, bit $B_{q-1}$ has the value of the $Y_{q-1}$ register, bit $B_{q-2}$ has the value of the $Y^{q-2}$ register, . . . , bit $B_2$ has the value of the $Y^2$ register, bit $B_1$ has the value of the $Y^1$ register, and bit $B_0$ has the value of the $Y^0$ register.

Since the given polynomial key word is a $q^{th}$ order polynomial, the first occurring "1" bit corresponds to the value of the $Y^q$ register. In FIG. 4, the first occurring "1" bit is in $Y^q$ register and so $Y^q$ is the MSB. Since the first "1" bit corresponds to the value of the $Y^q$ register, the i) selection input Last-$X^q$ (not shown in FIG. 3A) is programmed to be equal to 1. All other selection inputs such as, Last-$X^{n-1}$ 352, Last-$X^{n-2}$ (not shown in FIG. 3A), . . . , Last-$X^0$ 354, are programmed to have a value of zero.

The value of each selection input, such as Last-$X^{n-1}$ 352, Last-$X^{n-2}$ (not shown in FIG. 3A), . . . , Last-$X^0$ 354 determines which input lines 362, 370, 394, 358, 392, . . . , 387, 386, 395, 358, is selected at the corresponding multiplexers, $M_b^{n-1}$ $M_c^{n-1}$, . . . , $M_b^0$, $M_c^0$ to be output from the multiplexers $M^{bn-1}$ $M_c^{n-1}$, . . . , $M_b^0$, $M_c^0$.

For example, if selection input Last-$X^{n-1}$ 352 is programmed to have the value of 1, multiplexer $M_b^{n-1}$ 326 and multiplexer $M_c^{n-1}$ 328 will each receive the value 1 as an input. In FIG. 3A, it can be seen that multiplexer $M_b^{n-1}$ 326 and multiplexer $M_c^{n-1}$ 328 each has 2 input lines, labeled "1" and "0". Since the value 1 is received as the selection input by multiplexer $M_b^{n-1}$ and multiplexer $M_c^{n-1}$, multiplexer $M_b^{n-1}$ and multiplexer $M_c^{n-1}$ will each select the input line labeled "1" to be their output for a particular cycle.

As explained herein, there is no Last-$X^n$ selection input because there are no multiplexers that control the primary input into the XOR gate, $XOR^n$ 316. $XOR^n$ 316, being the first XOR gate in an N-bit capable CRC generator will always receive the primary input.

In FIG. 3A, multiplexer $M_{out}$ 342 has N+1 input lines, namely, $A^n$ 344, $A^{n-1}$ 346, . . . , up to $A^0$ 348. If selection input Last-$X^{n-1}$ 352 has a value of 1, then multiplexer $M_{out}$ 342 will select $A^{n-1}$ 346 to be CRC output 350. Similarly, if Last-$X^{n-2}$ (not shown in FIG. 3A) has a value of 1, then multiplexer $M_{out}$ 342 will select $A^{n-2}$ (not shown in FIG. 3A) to be CRC output 350, and so on.

Even though there is no Last-$X^n$ selection input, the effect of a selection input Last-$X^n$ can be obtained by making the selection of $A^n$ 344 as the default selection when all the selection inputs, namely, Last-$X^{(n-1)}$ 352, Last-$X^{(n-2)}$ (not shown in FIG. 3A), Last-$X^0$ 354 have a value of zero.

Additionally, multiplexers with the subscript "b", such as $M^{b(n-1)}$ 326, $M_b^{(n-2)}$ (not shown in FIG. 3A), $M_b^{(n-3)}$ (not shown in FIG. 3A), . . . , $M_b^0$ 332 are communicatively coupled to each other. Specifically, line 392 is an output line from $M_b^{(n-1)}$ 326. Line 392 is also an input line to $M_b^{(n-2)}$ (not shown in FIG. 3A). As previously explained herein, line 393 is shown as an output line from multiplexer $M_b^0$ 332. Line 393 is also an input line to shift register $X^0$ 314.

Multiplexers with the subscript "c" each receive a primary input, P 356. For example, multiplexers $M_c^{(n-1)}$ 328, $M_c^{(n-2)}$ (not shown in FIG. 3A), $M_c^{(n-3)}$ (not shown in FIG. 3A), . . . , $M_c^0$ 334 each receive a primary input, P 356. XOR gate $XOR^n$ 316 also receives primary input, P 356. Typically, primary input P 356 is a bitstream that is input into the XOR gates at the rate of one bit per cycle.

All multiplexers in the N-bit capable CRC generator have 2 input lines. One input line is labeled "1" and the other input line is labeled "0" as indicated in FIG. 3A.

The arrangement of the components in List B, i.e. the components that not shown in FIG. 3A, are the same as the arrangement of the components $Y^{(n-1)}$ 338, $XOR^{(n-1)}$ 318, $M^{a(n-1)}$ 324, $M_b^{(n-1)}$ 326, and $M_c^{(n-1)}$ 328 relative to each other.

3.0 Illustrative Example of the Flexibility of an N-Bit Capable CRC Generator

Figure 5:
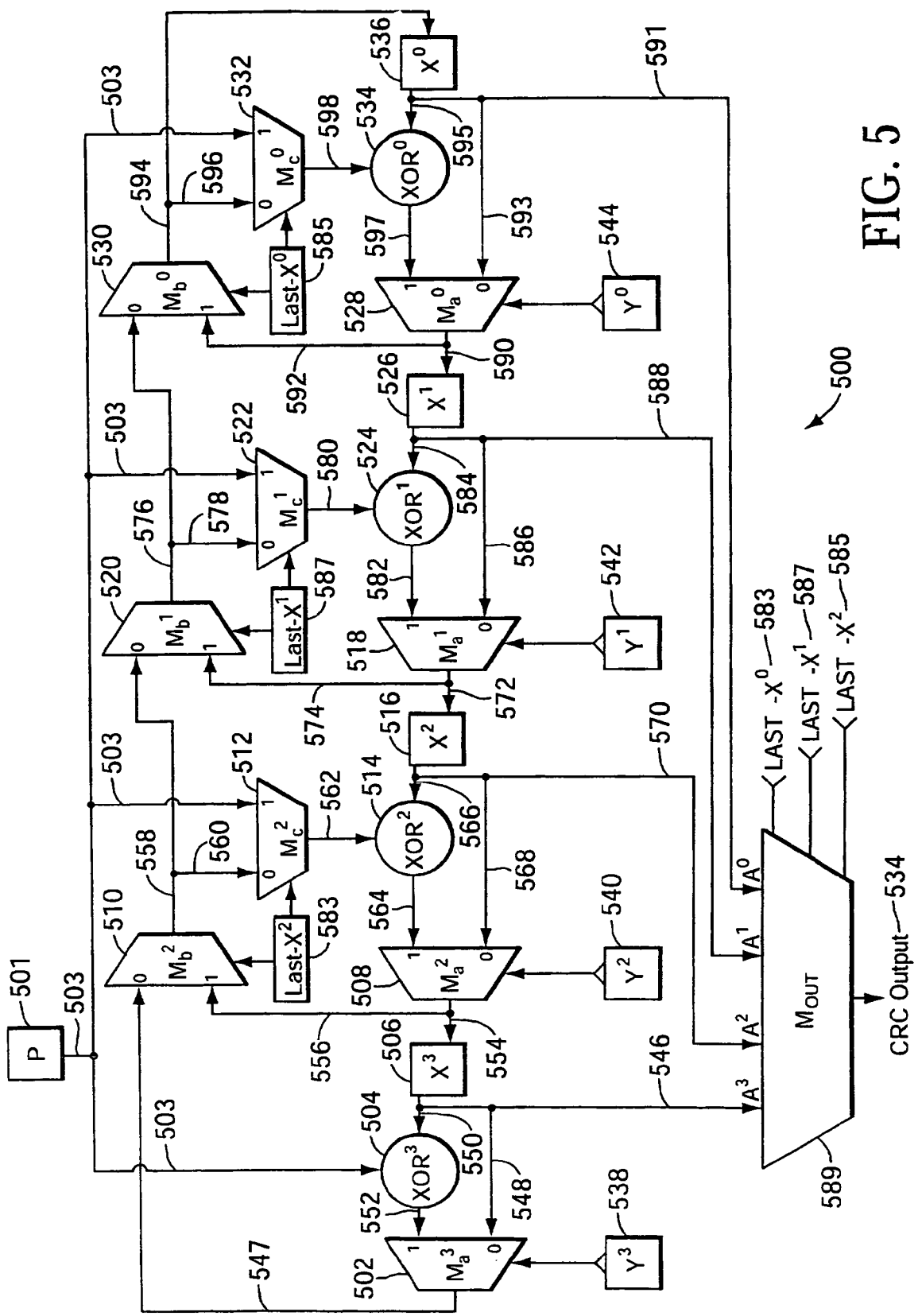
FIG. 5 is a block diagram that illustrates a 3-bit capable CRC generator.

Typically, N is equal to 64 or larger for the universal CRC generator. However, for simplicity of explanation, assume that N=3 for the N-bit capable CRC generator. FIG. 5 is a block diagram that illustrates a 3-bit capable CRC generator 500. A 3-bit capable CRC generator can be used for polynomial key words of orders ranging from 1 to 3.

In FIG. 5, shift register $X^3$ 506 is communicatively coupled to corresponding XOR gate, $XOR^3$ 504. Specifically, line 550 is an output line from shift register $X^3$ 506. Line 550 is also an input line to XOR gate, $XOR^3$ 504.

Further, shift register $X^3$ 506 is communicatively coupled to adjacent multiplexers $M_a^3$ 502 and $M_a^2$ 508. Specifically, line 548 is an output line from shift register $X^3$ 506. Line 548 is also an input line into $M_a^3$ 502. Line 554 is output line from $M_a^2$ 508. Line 554 is also an input line into shift register $X^3$ 506.

Similarly, shift register $X^2$ 516 is communicatively coupled to corresponding XOR gate, $XOR^2$ 514, and to adjacent multiplexers $M_a^2$ 508 and $M_a^1$ 518. Specifically, line 566 is an output line from shift register $X^2$ 516. Line 566 is also an input line to XOR gate, $XOR^2$ 514. Line 568 is an output line from shift register $X^2$ 516. Line 568 is also an input line into multiplexer $M_a^2$ 508. Line 572 is output line from multiplexer $M_a^1$ 518. Line 572 is also an input line into shift register $X^2$ 516.

Shift register $X^1$ 526 is communicatively coupled to corresponding XOR gate, $XOR^1$ 524, and to adjacent multiplexers $M_a^1$ 518 and $M_a^3$ 528. Specifically, line 584 is an output line from shift register $X^1$ 526. Line 584 is also an input line to XOR gate, $XOR^1$ 524. Line 586 is an output line from shift register $X^1$ 526. Line 586 is also an input line into multiplexer $M_a^1$ 518. Line 590 is output line from multiplexer $M_a^0$ 528. Line 590 is also an input line into shift register $X^1$ 526.

Shift register $X^0$ 536 is communicatively coupled to XOR gate, $XOR^0$ 534. In addition, shift register $X^0$ 536 is communicatively coupled to adjacent multiplexer $M_a^0$ 528. Specifically, line 595 is an output line from shift register $X^0$ 536. Line 595 is also an input line to XOR gate, $XOR^0$ 534. Line 593 is an output line from shift register $X^0$ 536. Line 593 is also an input line into multiplexer $M_a^0$ 528. Line 590 is output line from multiplexer $M_a^0$ 528.

Further, all shift registers $X^3$ 506, $X^2$ 516, $X^1$ 526, $X^0$ 536 are communicatively coupled to multiplexer $M_{out}$ 589 via output lines $A^3$ 546, $A^2$ 570, $A^1$ 588, and $A^0$ 591, respectively. CRC Output 534 is the output of the 3-bit capable CRC generator 500.

Each XOR gate is additionally communicatively coupled to either one or two corresponding adjacent multiplexers. In FIG. 5, XOR gate, $XOR^3$ 504 is communicatively coupled to one adjacent corresponding multiplexer $M_a^3$ 502. Line 552 is an output line from XOR gate, $XOR^3$ 504. Line 552 is also an input line to multiplexer $M_a^3$ 502.

Similarly, XOR gate, $XOR^2$ 514, is communicatively coupled to adjacent corresponding multiplexers $M_a^2$ 508 and $M_c^2$ 512. Line 564 is an output line from XOR gate, $XOR^2$ 514. Line 564 is also an input line to multiplexer $M_a^2$ 508. Line 562 is an output line from multiplexer $M_c^2$ 512. Line 562 is also an input line to XOR gate, $XOR^2$ 514.

XOR gate, $XOR^1$ 524, is communicatively coupled to adjacent corresponding multiplexers $M_a^1$ 518 and $M_c^1$ 522. Line 582 is an output line from XOR gate, $XOR^1$ 524. Line 582 is also an input line to multiplexer $M_a^1$ 518. Line 580 is an output line from multiplexer $M_c^1$ 522. Line 580 is also an input line to XOR gate, $XOR^1$ 524.

XOR gate, $XOR^0$ 534, is communicatively coupled to adjacent corresponding multiplexers $M_a^0$ 528 and $M_c^1$ 532. Line 597 is an output line from XOR gate, $XOR^0$ 534. Line 597 is also an input line to multiplexer $M_a^0$ 528. Line 598 is an output line from multiplexer $M_c^0$ 532. Line 598 is also an input line to XOR gate, $XOR^0$ 534.

Programmable registers $Y^3$ 538, $Y^2$ 540, $Y^1$ 542, and $Y^0$ 544 are each communicatively coupled to corresponding multiplexers $M_a^3$ 502, $M_a^2$ 508, $M_a^1$ 518, $M_a^0$ 528 respectively.

For example, programmable register $Y^3$ 502 is communicatively coupled to $M_a^3$ 502. Similarly, programmable register $Y^2$ 540 is coupled to $M_a^2$ 508. Programmable register $Y^1$ 532 is coupled to $M_a^1$ 518. Programmable register $Y^0$ 544 is coupled to $M_a^0$ 528.

For ease of explanation, multiplexers with the same superscript as illustrated in FIG. 5 are said to belong to the same family. As can be seen in FIG. 5, multiplexers that belong to the same family are communicatively coupled to form part of a feedback loop. For example, multiplexer $M_a^2$ 508 is communicatively coupled to multiplexer $M_b^2$ 510 that is in turn communicatively coupled to multiplexer $M_c^2$ 512. Specifically, line 556 is an output line from multiplexer $M_a^2$ 508. Line 556 is also an input line to multiplexer $M_b^2$ 510. Line 560 is an input line from multiplexer $M_b^2$ 510 to multiplexer $M_c^2$ 512.

Similarly, $M_a^1$ 518 is communicatively coupled to $M_b^1$ 520 that is in turn communicatively coupled to $M_c^1$ 522. Specifically, line 574 is an output line from multiplexer $M_a^1$ 518. Line 574 is also an input line to multiplexer $M_b^1$ 520. Line 578 is an input line from multiplexer $M_b^1$ 520 to multiplexer $M_c^1$ 522.

$M_a^0$ 528 is communicatively coupled to $M_b^0$ 530 that is in turn communicatively coupled to $M_c^0$ 532. Specifically, line 592 is an output line from multiplexer $M_a^0$ 528. Line 592 is also an input line to multiplexer $M_b^0$ 530. Line 596 is an input line from multiplexer $M_b^0$ 530 to multiplexer $M_c^0$ 532.

However, $M_a^3$ 502, being the sole member in its family is communicatively coupled to multiplexer $M_b^2$ 510. Line 547 is an output line from multiplexer $M_a^3$ 502 to multiplexer $M_b^2$ 510.

Inputs Last-$X^2$ 583, Last-$X^1$ 587, and Last-$X^0$ 585 are selection inputs into corresponding multiplexers with subscripts "b" and "c" and which belong to the same family. For example, Last-$X^2$ 583 is a selection input into multiplexers $M^{b2}$ 510 and $M_c^2$ 512. Last-$X^1$ 587 is a selection input into multiplexers $M_b^1$ 520 and $M_c^1$ 522. Last-$X^0$ 585 is a selection input into multiplexers $M_b^0$ 530 and $M_c^0$ 532. Further, all selection inputs Last-$X^2$ 583, Last-$X^1$ 587, and Last-$X^0$ 585 are input into multiplexer $M_{out}$ 589.

Additionally, multiplexers with the subscript "b", such as $M^{b2}$ 510, $M_b^1$ 520. $M_b^0$ 530 are communicatively coupled to each other. Multiplexers with the subscript "c" each receive a primary input, P 501 through line 503. For example, multiplexers $M_c^2$ 512, $M_c^1$ 522 and, $M_c^0$ 532 each receive a primary input, P 501. XOR gate $XOR^3$ 504 also receives primary input, P 501 through line 503. Typically, primary input P 501 is a bitstream that is to be checked for error by the CRC generator 500. Primary input P 501 is input into the XOR gates at the rate of one bit per cycle.

As a first illustration, assume that a CRC generator is needed to implement a given 320 polynomial key word of order 3. Further assume that the given polynomial is as follows:

$$X^3+X^2+1$$

The 3-bit capable CRC described with reference to FIG. 5 can be converted to specifically implement the polynomial key word, $X^3+X^{2+1}$. In other words, by programming the values of the Y registers and the Last-X selection inputs, the 3-bit capable CRC generator becomes a $X^3+X^2+1$ key word CRC generator. For purposes of explanation, the given polynomial key word is re-written to explicitly show coefficients and missing terms. Thus, the given polynomial key word, $X^3+X^2+1$, can be re-written as:

$$(1)X^3+(1)X^2+(0)X^1+(1)X^0$$

Referring to FIG. 5, programmable register $Y^3$ 538 corresponds to coefficient of $X^3$ of the given key word polynomial. Thus, programmable register $Y^3$ 538 is programmed to have the value of 1. In response to receiving the value of 1 from programmable register $Y^3$ 538, multiplexer $M_a^3$ 502, will select input line labeled "1".

Similarly, programmable register $Y^2$ 540 corresponds to coefficient $X^2$ of the given key word polynomial. Thus, programmable register $Y^2$ 540 is programmed to have the value of 1. In response to receiving the value of 1 from programmable register $Y^2$ 540, multiplexer $M_a^2$ 508, will select input line labeled "1".

Programmable register $Y^1$ 542 corresponds to coefficient $X^0$ of the given key word polynomial. Thus, programmable register $Y^1$ 542 is programmed to have the value of 0. In response to receiving the value of 0 from programmable register $Y^1$ 542, multiplexer $M_a^1$ 518, will select input line labeled "0".

Figure 6:
FIG. 6 is a block diagram that illustrates the position of the MSB that is associated with a $X^3+X^2+1$ key word.

Programmable register $Y^0$ 544 corresponds to coefficient $X^0$ of the given key word polynomial. Thus, programmable register $Y^0$ 544 is programmed to have the value of 1. In response to receiving the value of 1 from programmable register $Y^0$ 544, multiplexer $M_a^0$ 528, will select input line labeled The Last-X selection inputs are programmed to be a specific value based on the most significant bit (MSB). FIG. 6 is a block diagram that illustrates the position of the MSB that is associated with the polynomial key word, $X^3+x^{2+1}$. In FIG. 6, bit 610 has the value of the $Y^3$ register that is programmed to have a value of 1 described above. Since the first occurring "1" bit corresponds to the value of the $Y^3$ register, bit 610 represents the MSB.

Similarly, bit 612 has the value of the $Y^2$ register that is programmed to have a value of 1. Bit 614 has the value of the $Y^1$ register that is programmed to have a value of 0. Bit 616 has the value of the $Y^0$ register that is programmed to have a value of 1. Bit 616 is the LSB.

Since the first occurring "1" bit corresponds to the value of the $Y^3$ register, all Last-X selection inputs, namely, Last-$X^2$ 583, Last-$X^1$ 587, and Last-$X^1$ 585 in FIG. 5 are programmed to have a value of zero.

The value of each Last-X selection input determines which input is selected at the corresponding multiplexers to be output from said multiplexers. For example, since selection input Last-$X^2$ 583 is programmed to have the value of 0, multiplexer $M_b^2$ 510 and multiplexer $M_c^2$ 512 will each receive the value 0 as an input. In FIG. 5, it can be seen that multiplexer $M_b^2$ 510 and multiplexer $M_c^2$ 512 each has 2 input lines, labeled "1" and "0". Since the value 0 is received as the selection input, multiplexer $M_b^2$ 510 and multiplexer $M_c^2$ 512 will each select the input line labeled "0" to be their output for a particular cycle.

In FIG. 5, multiplexer $M_{out}$ 589 has 4 input lines, namely, $A^3$ 546, $A^2$ 570, $A^1$ 588, $A^0$ 591. Since all the selection inputs, namely, Last-$X^2$ 583, Last-$X^1$ 587, Last-$X^0$ 585, have the value of 0, multiplexer $M_{out}$ 589 will select $A^3$ 546 to be CRC output 534.

Figure 1:
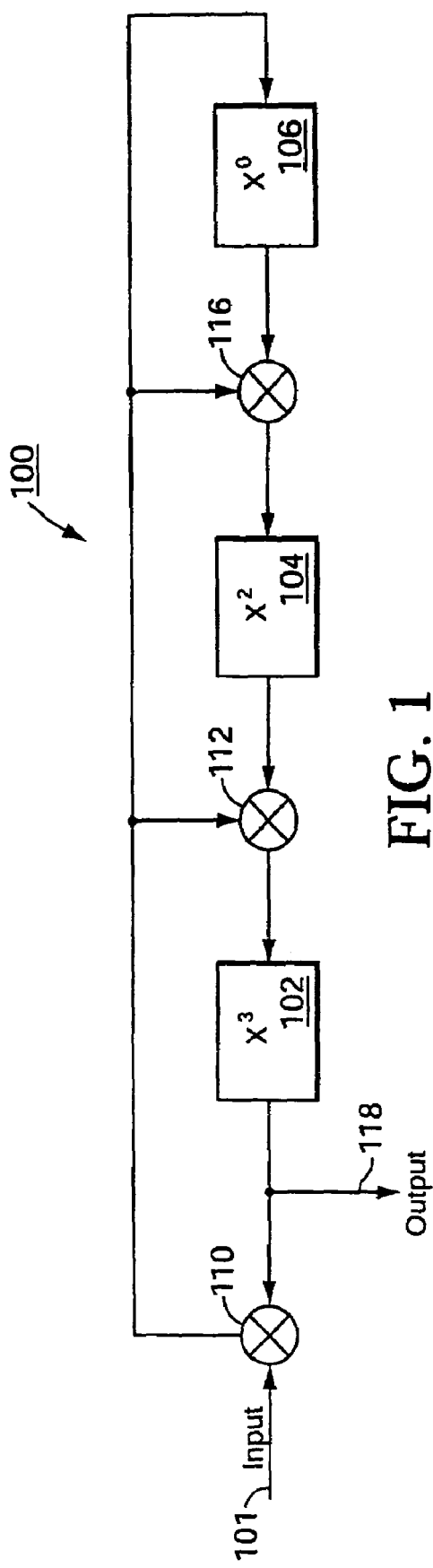
FIG. 1 is a block diagram that illustrates a prior art CRC generator that employs a $3^{rd}$ order polynomial key word.

Thus, by programming the Y registers and the Last-X selection inputs as described above, the 3-bit capable CRC generator is equivalent to the CRC generator as described in FIG. 1 herein.

Further, the same 3-bit capable CRC generator can be programmed to implement a given polynomial key word that is of an order that is lower than 3. Assume that the given polynomial is as follows:

$$X^1+1$$

For purposes of explanation, the given polynomial key word, $X^1+1$, is re-written to explicitly show coefficients and missing terms. Thus, the given polynomial key word, $X^1+1$, can be re-written as:

$$(0)X^3+(0)X^1+(1)X^1+(1)X^0$$

In FIG. 5 programmable register $Y^3$ 538 corresponds to coefficient of $X^3$ of the given key word polynomial. Thus, programmable register $Y^3$ 538 is programmed to have the value of 0. In response to receiving the value of 0 from programmable register $Y^3$ 538, multiplexer $M_a^3$ 502, will select input line labeled "0".

Similarly, programmable register $Y^2$ 540 corresponds to coefficient $X^2$ of the given key word polynomial. Thus, programmable register $Y^2$ 540 is programmed to have the value of 0. In response to receiving the value of 0 from programmable register $Y^2$ 540, multiplexer $M_a^2$ 508, will select input line labeled "0".

Programmable register $Y^1$ 542 corresponds to coefficient $X^1$ of the given key word polynomial. Thus, programmable register $Y^1$ 542 is programmed to have the value of 1. In response to receiving the value of 1 from programmable register $Y^1$ 542, multiplexer $M_a^1$ 518, will select input line labeled "1".

Programmable register $Y^0$ 544 corresponds to coefficient $X^0$ of the given key word polynomial. Thus, programmable register $Y^0$ 544 is programmed to have the value of 1. In response to receiving the value of 1 from programmable register $Y^0$ 544, multiplexer $M_a^0$ 528, will select input line labeled "1".

Figure 7:
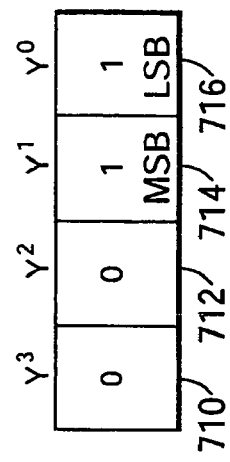
FIG. 7 is a block diagram that illustrates the position of the MSB that is associated with a $X^1+X^0$ key word.

The Last-X selection inputs are programmed to be a specific value based on the most significant bit (MSB) of the Y registers. FIG. 7 is a block diagram that illustrates the position of the MSB that is associated with a $X^1+X^0$ key word. In FIG. 7, bit 710 has the value of the register $Y^3$ that is programmed to have a value of 0 described above. Similarly, bit 712 has the value of the $Y^2$ register that is programmed to have a value of 0.

Bit 714 has the value of the $Y^1$ register that is programmed to have a value of 1. Since the first occurring "1" bit corresponds to the value of the $Y^1$ register, bit 714 represents the MSB. Bit 716 has the value of the $Y^0$ register that is programmed to have a value of 1. Bit 716 is the LSB.

Since the first occurring "1" bit corresponds to the value of register $Y^1$, selection input Last-$X^1$ 587 is programmed to have a value of 1, and selection inputs Last-$X^2$ 583 and Last-$X^0$ 585 are programmed to have a value of 0.

The value of each Last-X selection input determines which input is selected at the corresponding multiplexers to be output from said multiplexers.

Referring back to FIG. 5, since selection input Last-$X^2$ 583 has the value 0, multiplexer $M_b^2$ 510 and multiplexer $M_c^2$ 512 will each select the input line labeled "0" to be their output for a particular cycle. Similarly, since selection input Last-$X^0$ 585 has the value 0, multiplexer $M_b^0$ 530 and multiplexer $M_c^0$ 532 will each select the input line labeled "0" to be their output for a particular cycle.

In contrast, since selection input Last-$X^1$ 587 has the value 1, multiplexer $M_b^1$ 520 and multiplexer $M_c^1$ 522 will each select the input line labeled "1" to be their output for a particular $X^0$ cycle.

In FIG. 5, multiplexer $M_{out}$ 589 has 4 input lines, namely, $A^3$ 546, $A^2$ 570, $A^1$ 588, $A^0$ 591. Since the selection input Last-$X^1$ 587 has the value of 1, multiplexer $M_{out}$ 589 will select $A^1$ 588 to be CRC output 534.

Figure 2:
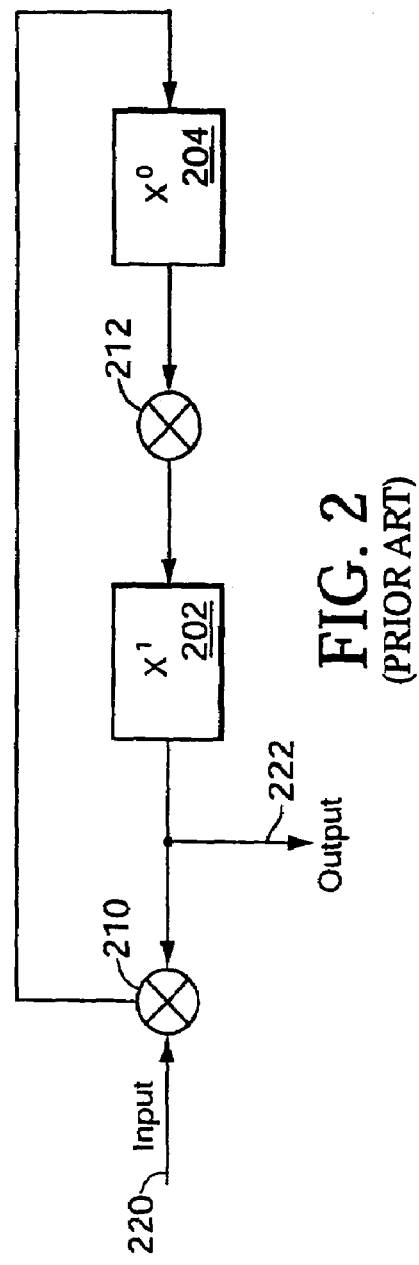
FIG. 2 is block diagram that illustrates a prior art CRC generator that employs a 1st order polynomial key word.

Thus, by programming the Y registers and the Last-X selection inputs as described above, the 3-bit capable CRC generator 500 is equivalent to the CRC generator as described in FIG. 2.

5.0 Extensions and Alternatives

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A Cyclic Redundancy Check (CRC) system, comprising:
    N+1 shift registers;
    N+1 logic gates having first inputs that communicate with outputs of corresponding ones of said N+1 shift registers;
    N+1 programmable registers, wherein each of said N+1 programmable registers stores a corresponding CRC coefficient of a $3^{rd}$ to $N^{th}$ order CRC polynomial key word, wherein N is an integer greater than two; and
    N+1 multiplexers that communicate with outputs of corresponding ones of said N+1 logic gates, wherein at least N of said N+1 multiplexers communicate with corresponding ones of at least N of said N+1 programmable registers.

2. The CRC system of claim 1 further comprising M multiplexers that communicate with inputs of at least N of said N+1 logic gates, where M=N.

3. The CRC system of claim 2 further comprising P multiplexers that communicate with corresponding outputs of at least N of said N+1 multiplexers and with corresponding inputs of said M multiplexers.

4. The CRC system of claim 1 further comprising an output multiplexer that communicates with outputs of said N+1 shift registers.

5. A Cyclic Redundancy Check (CRC) system, comprising:
    N+1 means for shifting;
    N+1 means for providing a logic function and having first inputs that communicate with outputs of corresponding ones of said N+1 means for shifting;
    N+1 programmable storing means for storing, wherein each of said N+1 programmable storing means stores a corresponding CRC coefficient of a $3^{rd}$ to $N^{th}$ order CRC polynomial key word, wherein N is an integer greater than two; and
    N+1 multiplexing means for multiplexing that communicate with outputs of corresponding ones of said N+1 means for providing the logic function, wherein at least N of said N+1 multiplexing means communicate with corresponding ones of at least N of said N+1 programmable storing means.

6. The CRC system of claim 5 further comprising M multiplexing means that communicate with inputs of at least N of said N+1 means for providing the logic function, where M=N.

7. The CRC system of claim 6 further comprising P multiplexing means that communicate with corresponding outputs of at least N of said N+1 multiplexing means and with corresponding inputs of said M multiplexing means.

8. The CRC system of claim 5 further comprising output multiplexing means that communicates with outputs of said N+1 means for shifting.

* * * * *

UNITED STATES PATENT AND TRADEMARK OFFICE
CERTIFICATE OF CORRECTION

PATENT NO. : 7,418,648 B2 Page 1 of 1
APPLICATION NO. : 11/385962
DATED : August 26, 2008
INVENTOR(S) : Hongyi Hubert Chen It is certified that error appears in the above-identified patent and that said Letters Patent is hereby corrected as shown below:

| | |
|---|---|
| Title Page, Line 5 | Delete "Nth" and insert -- $N^{th}$ -- |
| Column 2, Line 21 | Insert -- a -- after "is" |
| Column 2, Line 23 | Insert -- a -- after "is" |
| Column 3, Line 24 | Insert -- the -- after "of" |
| Column 3, Line 24 | Insert -- a -- after "is" |
| Column 4, Line 11 | Delete "$M^{a(n-2)}$" and insert -- $M_a^{(n-2)}$ -- |
| Column 5, Line 40 | Delete "$M^{c(n-1)}$" and insert -- $M_c^{(n-1)}$ -- |
| Column 6, Line 13 | Delete "$M^{b(n-1)}$" and insert -- $M_b^{(n-1)}$ -- |
| Column 6, Line 41 | Delete "$M^{b(n-1)}$" and insert -- $M_b^{(n-1)}$ -- |
| Column 6, Line 61 | Delete "$M^{a(n-1)}$" and insert -- $M_a^{(n-1)}$ -- |
| Column 6, Line 59 | Insert -- are -- after "that" |
| Column 7, Line 11 | Insert -- an -- after "554 is" |
| Column 7, Line 20 | Insert -- an -- after "is" |
| Column 7, Line 29 | Insert -- an -- after "is" |
| Column 7, Line 37 | Insert -- an -- after "is" |
| Column 8, Line 39 | Delete "$M^{b2}$" and insert -- $M_b^2$ -- |
| Column 8, Line 45 | Delete "$M^{b2}$" and insert -- $M_b^2$ -- |
| Column 8, Line 63 | Delete "$X^3 + X^{2+1}$" and insert -- $X^3 + X^2 + 1$ -- |
| Column 9, Line 19 | Delete "$X^0$" and insert -- $X^1$ -- |
| Column 9, Line 29 | Insert -- "1". -- |
| Column 9, Line 33 | Delete "$X^3 + x^{2+1}$" and insert -- $X^3 + X^2 + 1$ -- |

Signed and Sealed this

Ninth Day of December, 2008

JON W. DUDAS
*Director of the United States Patent and Trademark Office*